United States Patent
Chan et al.

(10) Patent No.: US 8,198,808 B2
(45) Date of Patent: Jun. 12, 2012

(54) ACTIVE MATRIX DISPLAY AND IMAGE DISPLAY SYSTEM USING SAME

(75) Inventors: Chuan-Yi Chan, Taipei (TW); Du-Zen Peng, Hsinchu (TW); Ryuji Nishikawa, Chu-Nan (TW)

(73) Assignee: Chimei Innolux Corporation, Chu-Nan (TW)

( * ) Notice: Subject to any disclaimer, the term of this patent is extended or adjusted under 35 U.S.C. 154(b) by 321 days.

(21) Appl. No.: 12/430,020

(22) Filed: Apr. 24, 2009

(65) Prior Publication Data
US 2009/0267501 A1    Oct. 29, 2009

(30) Foreign Application Priority Data
Apr. 25, 2008   (TW) .............................. 97115465 A

(51) Int. Cl.
*H01L 51/00*    (2006.01)
(52) U.S. Cl. ....................................... 313/512; 313/506
(58) Field of Classification Search ........... 313/498–512
See application file for complete search history.

(56) References Cited

U.S. PATENT DOCUMENTS

| | | | |
|---|---|---|---|
| 7,190,111 B2 | 3/2007 | Lee et al. | |
| 7,224,115 B2 | 5/2007 | Sato et al. | |
| 2003/0132896 A1 | 7/2003 | Matsueda | |
| 2004/0113550 A1* | 6/2004 | Adachi et al. | 313/512 |
| 2005/0001963 A1 | 1/2005 | Yokoyama | |
| 2006/0049747 A1 | 3/2006 | Matsuda et al. | |
| 2006/0243976 A1 | 11/2006 | Shin | |
| 2006/0250333 A1 | 11/2006 | Matsueda | |
| 2007/0063645 A1* | 3/2007 | Yokoyama | 313/506 |
| 2011/0042692 A1 | 2/2011 | Matsueda | |

FOREIGN PATENT DOCUMENTS

JP   2007-317606   12/2007

* cited by examiner

*Primary Examiner* — Anne Hines
(74) *Attorney, Agent, or Firm* — Liu & Liu

(57) ABSTRACT

The present invention relates to an active matrix display and an image display system using the active matrix display. The image display system includes the active matrix display and a power supply apparatus. The active matrix display includes an active matrix substrate, a reflective layer and a sidewall-protective structure. The reflective layer is formed above the active matrix substrate and has first and second surfaces. The second surface faces the active matrix substrate. The sidewall-protective structure is formed above the active matrix substrate and surrounds the sidewalls of the reflective layer adjacent to the first and second surfaces.

17 Claims, 11 Drawing Sheets

ACTIVE MATRIX DISPLAY AND IMAGE DISPLAY SYSTEM USING SAME

FIELD OF THE INVENTION

The present invention relates to an active matrix display, and more particularly to an active matrix display having a sidewall-protective structure for protecting the anode reflective layer.

BACKGROUND OF THE INVENTION

A thin film transistor liquid crystal display (TFT-LCD) is a variant of liquid crystal display (LCD) which uses thin film transistor (TFT) technology to improve image quality. With recent interests and development, an organic light-emitting diode (OLED) device has become a potential candidate to replace LCDs for next-generation display. Depending on the direction of output light, the TFT-LCD devices are generally classified into three types, i.e. a transmissive LCD, a reflective LCD, and a transflective LCD. Whereas, the OLED devices are generally classified into two types, i.e. a bottom emission OLED device and a top emission OLED device. In the reflective LCD and the transflective LCD, a reflective layer with a high reflectivity is disposed under the glass substrate for reflecting the ambient light so as to light up the whole LCD. The top emission OLED device uses an anode electrode as a reflective layer. When a current passes through the light-emitting material layer of the top emission OLED device, the light emitted from the top emission OLED device is reflected by the anode electrode (reflective layer) so as to achieve the purpose of top emission.

Conventionally, the highly reflective metallic material used in the reflective layer includes for example silver (Ag), aluminum (Al), platinum (Pt), and so on. During production of the top emission OLED device, the highly reflective metallic material is readily exfoliated by the acidic/basic action of the etchant solution and thus the emission quality and efficiency is impaired. For solving such a problem, a reflective layer having a multi-layered structure is proposed. In the multi-layered structure, a highly reflective metallic material layer is sandwiched between conductive oxide material layers such as ITO (Indium Tin Oxide) or IZO (Indium Zinc Oxide) so as to protect the highly reflective metallic material layer during production. The process of forming the multi-layered structure of the reflective layer is disclosed in for example U.S. Pat. No. 7,224,115 and U.S. Pat. No. 7,190,111 and US Patent Publication Nos. US2006/0049747 and US2006/0243976.

FIG. 1 is a cross-sectional view of an OLED device having a multi-layered anode structure disclosed in U.S. Pat. No. 7,224,115. As shown in FIG. 1, the OLED device comprises an anode layer 10, a hole transport layer 11, an emission layer 12, an electron transport layer 13, a hole injection layer 14, a cathode layer 15, a planarization layer 16, an insulator layer 17, a via hole 18 and a gate electrode 19. The anode layer 10 is a three-layered structure including a first anode 101, a second anode 102 and a third anode 103. The first anode 101 is made of highly reflective metallic material such as silver (Ag), aluminum (Al) or Ag/Al alloy. The second anode 102 and the third anode 103 are made of conductive oxide material such as ITO (Indium Tin Oxide) or IZO (Indium Zinc Oxide). Although the multi-layered anode structure is capable of protecting the highly reflective metallic material from being attacked during production, there are still some drawbacks. For example, since the second anode 102 and the third anode 103 can only protect the top surface and the bottom surface of the first anode 101, the periphery of the first anode 101 is possibly etched and exfoliated on account of occasional reasons.

Therefore, there is a need of providing an active matrix display having a sidewall-protective structure for protecting the anode reflective layer to obviate the drawbacks encountered from the prior art.

SUMMARY OF THE INVENTION

In accordance with an aspect of the present invention, there is provided an active matrix display. The active matrix display includes an active matrix substrate, a reflective layer and a sidewall-protective structure. The reflective layer is formed above the active matrix substrate and has first and second surfaces. The second surface faces the active matrix substrate. The sidewall-protective structure is formed above the active matrix substrate and surrounds the sidewalls of the reflective layer adjacent to the first and second surfaces.

In accordance with another aspect of the present invention, there is provided an image display system. The image display system includes an active matrix display of the present invention and a power supply apparatus. The power supply apparatus is electrically connected to the active matrix display for providing electric energy to power the active matrix display.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
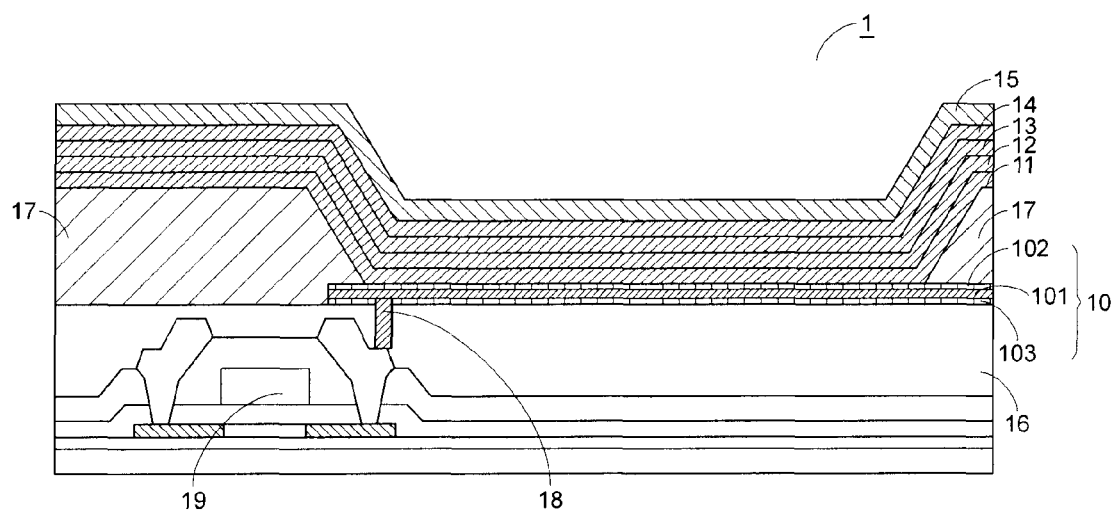
FIG. 1 is a cross-sectional view of an OLED device having a multi-layered anode structure according to prior art.
Figure 2A:
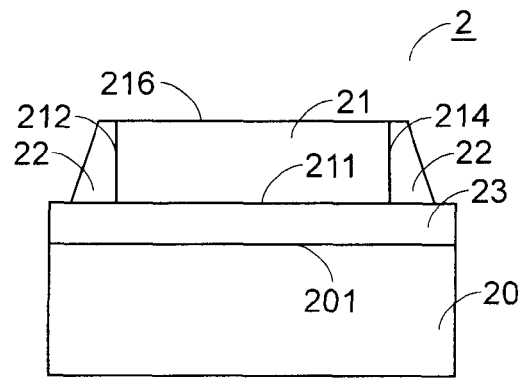
FIGS. 2A and 2B are respectively schematic cross-sectional and top views of an active matrix display according to a first embodiment of the present invention.
Figure 2B:
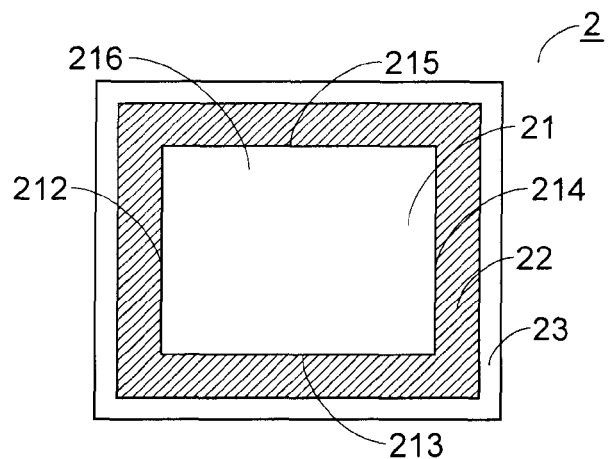

FIGS. 2A and 2B are respectively schematic cross-sectional and top views of an active matrix display according to a first embodiment of the present invention. As shown in FIGS. 2A and 2B, the active matrix display 2 comprises an active matrix substrate 20, a reflective layer 21 and a sidewall-protective structure 22. The active matrix substrate 20 contains a matrix of thin film transistors (not shown). When a current passes through a thin film transistor, the change of electric field determines the brightness value of the light emitted by the active matrix display 2. The reflective layer 21 is made of highly reflective metallic material such as silver (Ag), aluminum (Al), aluminum alloy or silver alloy. The reflective layer 21 is formed over the active matrix substrate 20 and the bottom surface 211 of the reflective layer 21 faces the top surface 201 of the active matrix substrate 20. The sidewall-protective structure 22 is made of metallic oxide material such as silicon nitride (SiNx), silicon oxide (SiOx), indium tin oxide (ITO), indium zinc oxide (IZO) or zinc oxide (ZnO). The sidewall-protective structure 22 is formed over the active matrix substrate 20 and surrounds the sidewalls 212, 213, 214 and 215 adjacent to the bottom surface 211 of the reflective layer 21. Furthermore, a passivation layer 23 is formed on the top surface 201 of the active matrix substrate 20 and contacted with the bottom surface 211 of the reflective layer 21 and the sidewall-protective structure 22.

Figure 2C:
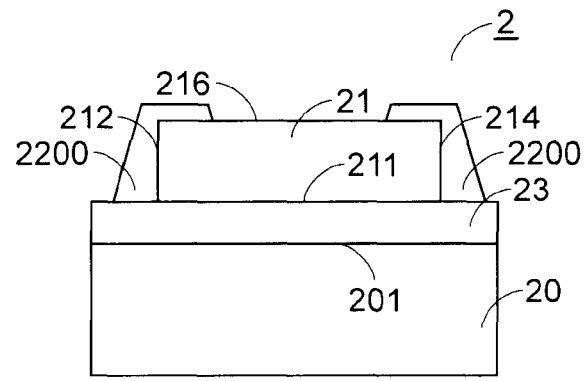
FIG. 2C is a schematic cross-sectional view illustrating a variant of the active matrix display of FIG. 2A.

FIG. 2C is a schematic cross-sectional view illustrating a variant of the active matrix display of FIG. 2A. By a photolithography and etching procedure, another sidewall-protective structure 2200 is also formed over the active matrix substrate 20 and surrounds the sidewalls 212, 214 of the reflective layer 21. In addition, the sidewall-protective structure 2200 is extended over the top surface 216 of the reflective layer 21 so as to partially cover the edges of the top surface 216 of the reflective layer 21.

From the description of the first embodiment, it is found that the sidewall-protective structure formed around the sidewalls of the reflective layer may protect the reflective layer of the active matrix display. In this embodiment, the reflective layer is an anode layer with a single-layered structure.

Alternatively, the reflective layer of the active matrix display may have a multi-layered anode structure as used in the conventional OLED device. Likewise, a highly reflective metallic material layer is used in the multi-layered anode structure. Hereinafter, an active matrix display having a multi-layered anode structure as the reflective layer will be illustrated in more details with reference to FIGS. 3A, 3B, 3C, 3D and 3E.

Figure 3A:
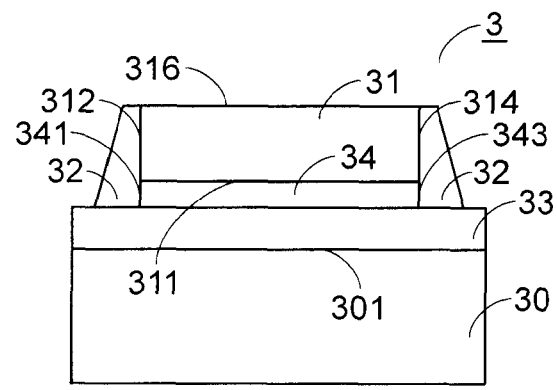
FIGS. 3A and 3B are respectively schematic cross-sectional and top views of an active matrix display according to a second embodiment of the present invention.
Figure 3B:
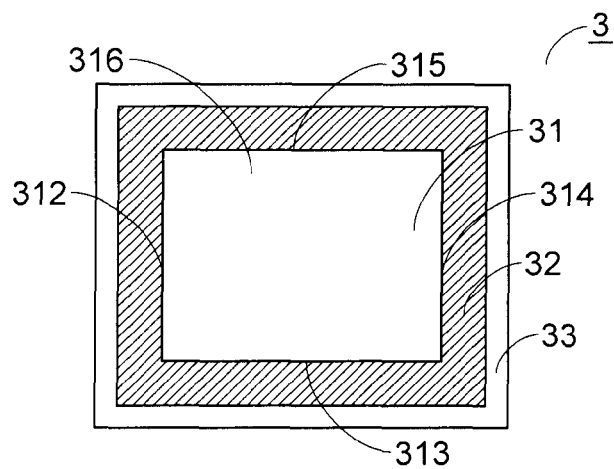

FIGS. 3A and 3B are respectively schematic cross-sectional and top views of an active matrix display according to a second embodiment of the present invention. As shown in FIGS. 3A and 3B, the active matrix display 3 comprises an active matrix substrate 30, a reflective layer 31, a sidewall-protective structure 32, a passivation layer 33 and a metallic oxide layer 34. In comparison with the first embodiment, the active matrix display 3 of this embodiment has the metallic oxide layer 34 between the passivation layer 33 and the reflective layer 31. Like the planarization layer as described in the conventional OLED device, the passivation layer 33 is made of polymeric material which has poor viscosity relative to metallic material. The arrangement of the metallic oxide layer 34 between the passivation layer 33 and the reflective layer 31 may facilitate enhancing the viscosity of the passivation layer 33 relative to the reflective layer 31. The sidewall-protective structure 32 is also formed over the active matrix substrate 30 and surrounds the sidewalls 312, 313, 314 and 315 of the reflective layer 31 and the sidewalls 341 and 343 of the metallic oxide layer 34.

Figure 3C:
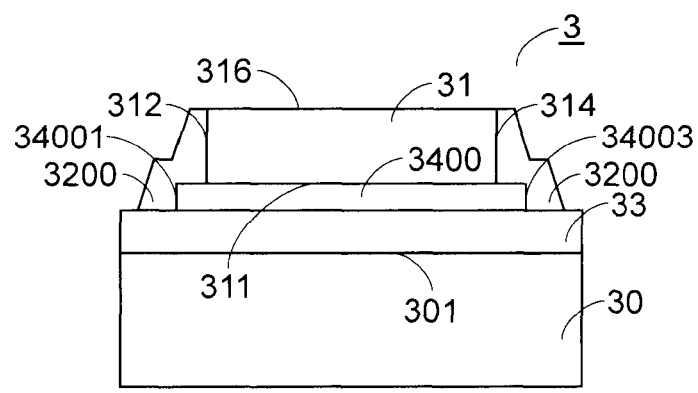
FIGS. 3C, 3D and 3E are schematic cross-sectional views illustrating three variants of the active matrix display of FIG. 3A.
Figure 3D:
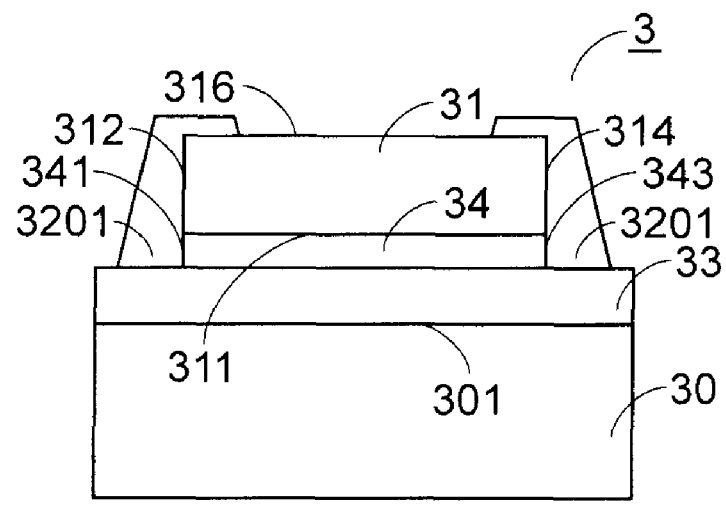
Figure 3E:
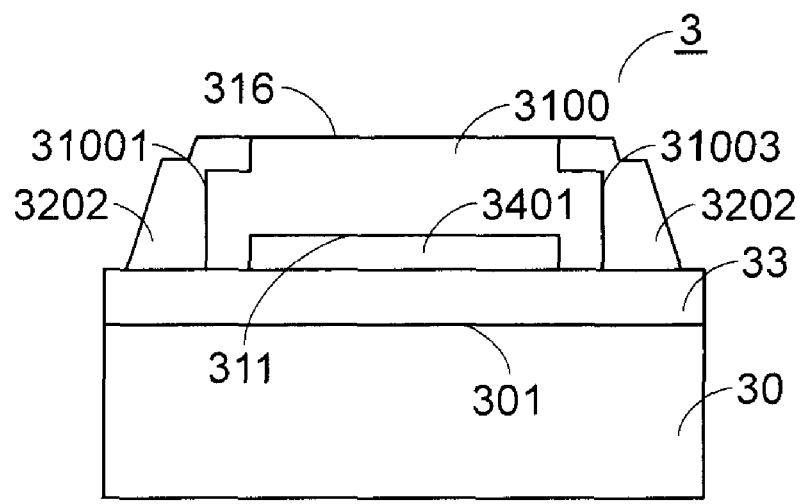

FIGS. 3C, 3D and 3E are schematic cross-sectional views illustrating three variants of the active matrix display of FIG. 3A. As shown in FIG. 3C, the area of the metallic oxide layer 3400 is greater than that of the reflective layer 31 such that a portion of the metallic oxide layer 3400 is exposed outside the reflective layer 31. Similarly, the sidewall-protective structure 3200 surrounds the sidewalls 312, 314 of the reflective layer 31 and the sidewalls 34001, 34003 of the metallic oxide layer 3400. In addition, the portion of the metallic oxide layer 3400 exposed outside the reflective layer 31 is also covered by the sidewall-protective structure 3200. As shown in FIG. 3D, the sidewall-protective structure 3201 is also formed over the active matrix substrate 30 and surrounds the sidewalls 312, 314 of the reflective layer 31 and the sidewalls 341, 343 of the metallic oxide layer 34. In addition, the sidewall-protective structure 3201 is extended over the top surface 316 of the reflective layer 31 so as to partially cover the edges of the top surface 316 of the reflective layer 31. As shown in FIG. 3E, the area of the metallic oxide layer 3401 is smaller than that of the reflective layer 3100 such that the metallic oxide layer 3401 is enclosed by the reflective layer 3100. Similarly, the sidewall-protective structure 3202 surrounds the sidewalls 31001, 31003 of the reflective layer 31. In addition, the sidewall-protective structure 3202 is extended over the top surface 316 of the reflective layer 31 so as to partially cover the edges of the top surface 316 of the reflective layer 31. The functions of other components are similar to those illustrated in the first embodiment, and are not redundantly described herein. In the above variants of the second embodiment, the sidewall-protective structure surrounds four sidewalls of the metallic oxide layer and/or four sidewalls of the reflective layer 3100. For clarification, only two of the four sidewalls are shown in the drawings.

Figure 4A:
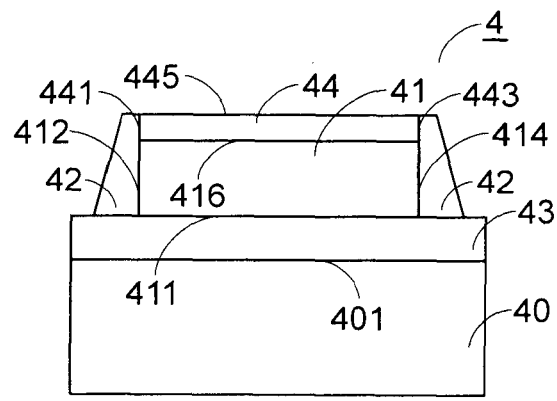
FIGS. 4A and 4B are respectively schematic cross-sectional and top views of an active matrix display according to a third embodiment of the present invention.
Figure 4B:
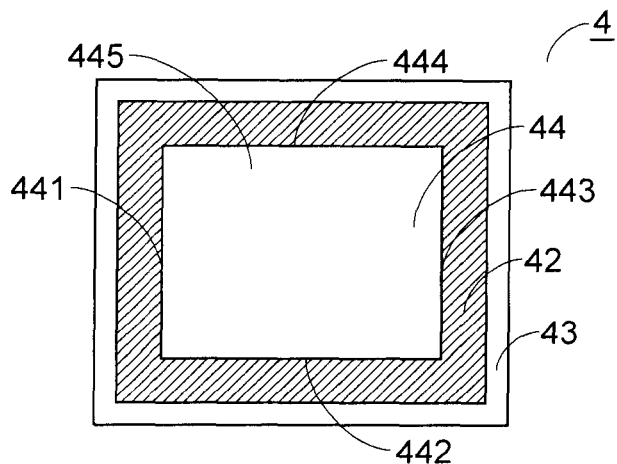

FIGS. 4A and 4B are respectively schematic cross-sectional and top views of an active matrix display according to a third embodiment of the present invention. As shown in FIGS. 4A and 4B, the active matrix display 4 comprises an active matrix substrate 40, a reflective layer 41, a sidewall-protective structure 42, a passivation layer 43 and a metallic oxide layer 44. The passivation layer 43 is formed on a top surface 401 of the active matrix substrate 40. In comparison with the above embodiments, the metallic oxide layer 44 is formed on a top surface 416 of the reflective layer 41. The sidewall-protective structure 42 surrounds the sidewalls 412, 414 of the reflective layer 41 and the sidewalls 441, 442, 443, 444 of the metallic oxide layer 44.

Figure 4C:
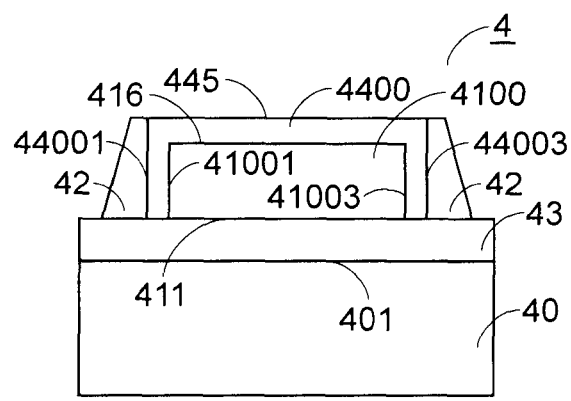
FIGS. 4C, 4D, 4E and 4F are schematic cross-sectional views illustrating four variants of the active matrix display of FIG. 4A.
Figure 4D:
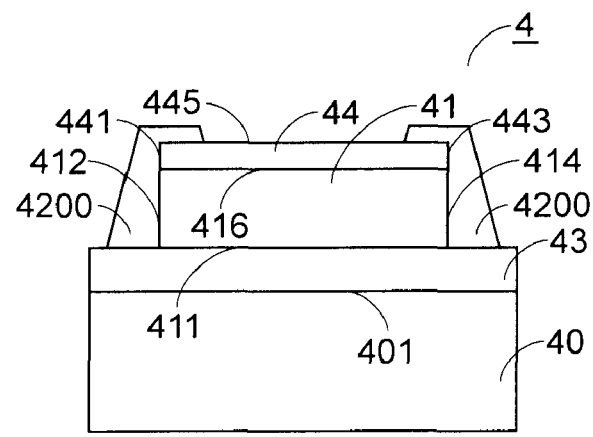
Figure 4E:
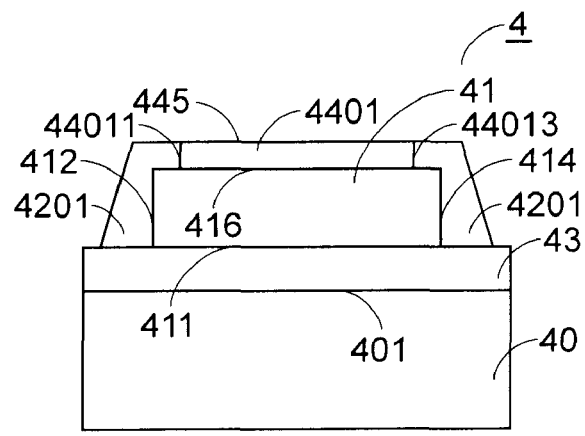
Figure 4F:
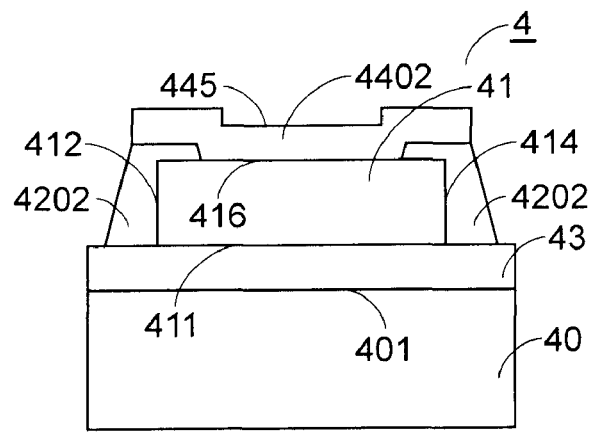

FIGS. 4C, 4D, 4E and 4F are schematic cross-sectional views illustrating four variants of the active matrix display of FIG. 4A. As shown in FIG. 4C, the metallic oxide layer 4400 is extended over the sidewalls 41001 and 41003 of the reflective layer 4100 such that the reflective layer 4100 is enclosed by the metallic oxide layer 4400. The sidewall-protective structure 42 surrounds the sidewalls 44001, 44003 of the metallic oxide layer 4400. Since the reflective layer 4100 is enclosed by the metallic oxide layer 4400, the metallic oxide layer 4400 has the same function as the sidewall-protective structure. Under this circumstance, the sidewall-protective structure 42 may be selectively dispensed with. As shown in FIG. 4D, the sidewall-protective structure 4200 surrounds the sidewalls 412, 414 of the reflective layer 41 and the sidewalls 441, 443 of the metallic oxide layer 44. In addition, the sidewall-protective structure 4200 is extended over the top surface 445 of the metallic oxide layer 44 so as to partially cover the edges of the top surface 445 of the metallic oxide layer 44. As shown in FIG. 4E, the area of the metallic oxide layer 4401 is smaller than that of the reflective layer 41. The sidewall-protective structure 4201 surrounds the sidewalls 412, 414 of the reflective layer 41 and the sidewalls 44011, 44013 of the metallic oxide layer 4401. In addition, the sidewall-protective structure 4201 is extended over the top surface 416 of the reflective layer 41 so as to partially cover the edges of the top surface 416 of the reflective layer 41 and contact with the metallic oxide layer 44. As shown in FIG. 4F, the sidewall-protective structure 4202 surrounds the sidewalls 412, 414 of the reflective layer 41 and is extended over the top surface 416 of the reflective layer 41 so as to partially cover the edges of the top surface 416 of the reflective layer 41. In addition, the metallic oxide layer 4402 is formed on the top surface 416 of the reflective layer 41 and the sidewall-protective structure 4202. In the above variants of the third embodiment, the metallic oxide layer is formed on the reflective layer to prevent from exposing the reflective layer. Consequently, the reflective layer will not be damaged by oxidation or in further processing procedures so as to maintain a good reflectivity. The functions of other components are similar to those illustrated in the first embodiment, and are not redundantly described herein.

Figure 5A:
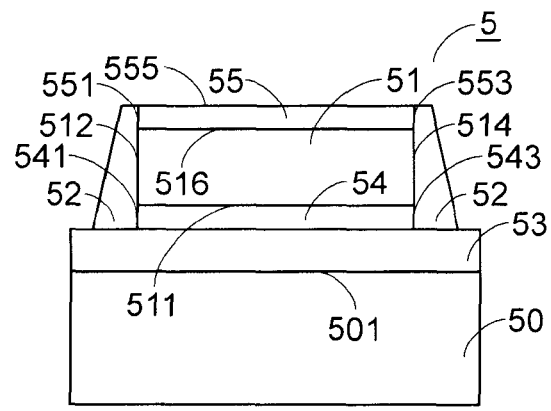
FIGS. 5A and 5B are respectively schematic cross-sectional and top views of an active matrix display according to a fourth embodiment of the present invention.
Figure 5B:
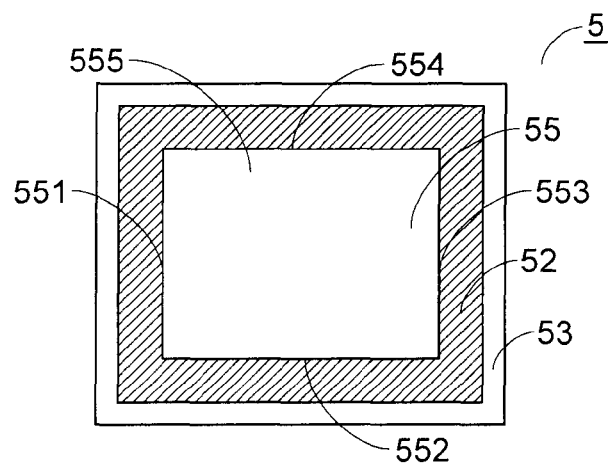

FIGS. 5A and 5B are respectively schematic cross-sectional and top views of an active matrix display according to a fourth embodiment of the present invention. As shown in FIGS. 5A and 5B, the active matrix display 5 comprises an active matrix substrate 40, a reflective layer 51, a sidewall-protective structure 52, a passivation layer 53, a first metallic oxide layer 54 and a second metallic oxide layer 55. The passivation layer 53 is formed on a top surface 501 of the active matrix substrate 50. In comparison with the above embodiments, the first metallic oxide layer 54 is formed between the reflective layer 51 and the passivation layer 53, and the second metallic oxide layer 55 is formed on a top surface 516 of the reflective layer 51. The sidewall-protective structure 52 surrounds the sidewalls 512, 514 of the reflective layer 51, the sidewalls 541, 543 of the first metallic oxide layer 54 and the sidewalls 551, 552, 553, 554 of the second metallic oxide layer 55.

Figure 5C:
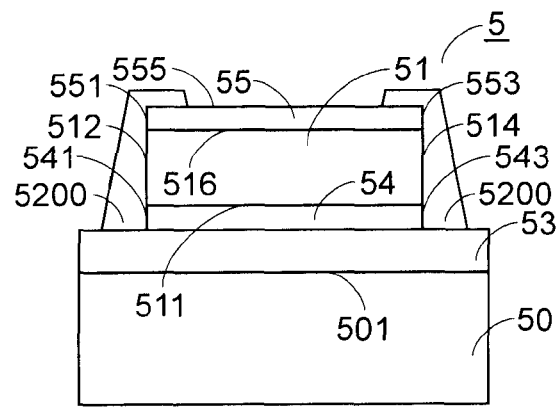
FIGS. 5C, 5D and 5E are schematic cross-sectional views illustrating three variants of the active matrix display of FIG. 5A.
Figure 5D:
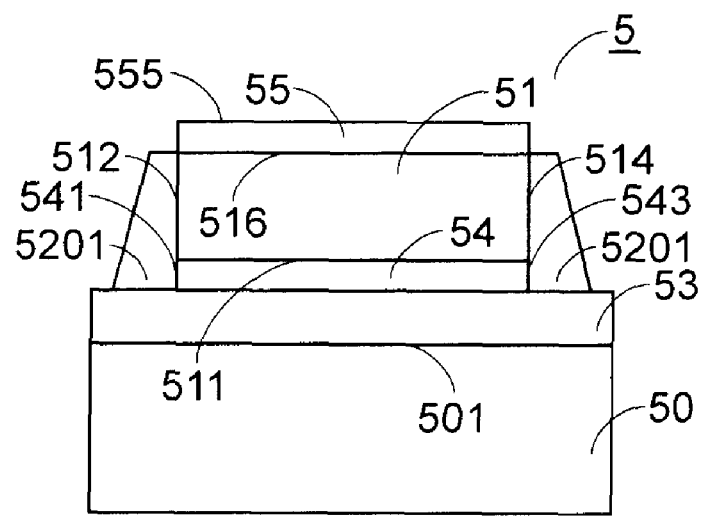
Figure 5E:
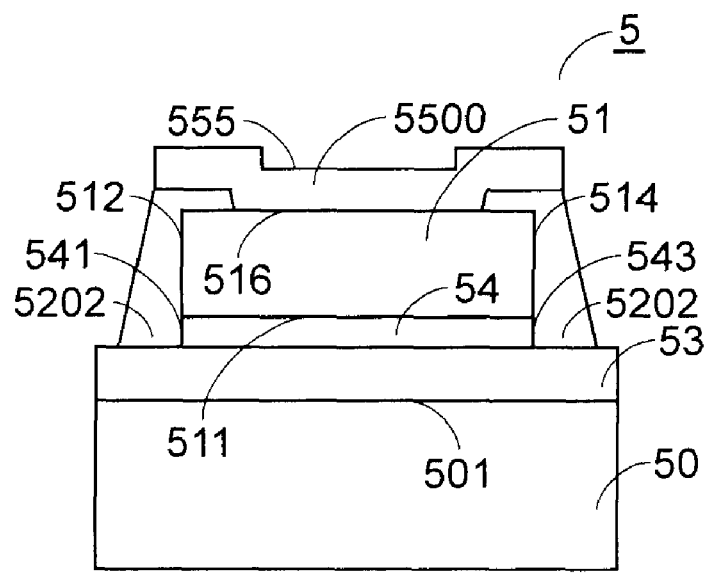

FIGS. 5C, 5D and 5E are schematic cross-sectional views illustrating three variants of the active matrix display of FIG. 5A. As shown in FIG. 5C, the sidewall-protective structure 5200 surrounds the sidewalls 512, 514 of the reflective layer 51, the sidewalls 541, 543 of the first metallic oxide layer 54 and the sidewalls 551, 553 of the second metallic oxide layer 55. In addition, the sidewall-protective structure 5200 is extended over the top surface 555 of the second metallic oxide layer 55 so as to partially cover the edges of the top surface 555 of the second metallic oxide layer 55. As shown in FIG. 5D, the sidewall-protective structure 5201 surrounds the sidewalls 512, 514 of the reflective layer 51 and the sidewalls 541, 543 of the first metallic oxide layer 54. The second metallic oxide layer 55 is formed on the top surface 516 of the reflective layer 51. As shown in FIG. 5E, the sidewall-protective structure 5202 surrounds the sidewalls 512, 514 of the reflective layer 51 and the sidewalls 541, 543 of the first metallic oxide layer 54 and is extended over the top surface 516 of the reflective layer 51 so as to partially cover the edges of the top surface 516 of the reflective layer 51. In addition, the second metallic oxide layer 5500 is formed on the top surface 516 of the reflective layer 51 and the sidewall-protective structure 5202. The functions of other components are similar to those illustrated in the first embodiment, and are not redundantly described herein.

Figure 6A:
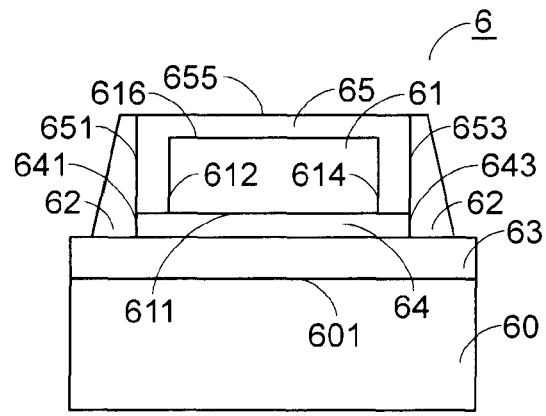
FIGS. 6A and 6B are respectively schematic cross-sectional and top views of an active matrix display according to a fifth embodiment of the present invention.
Figure 6B:
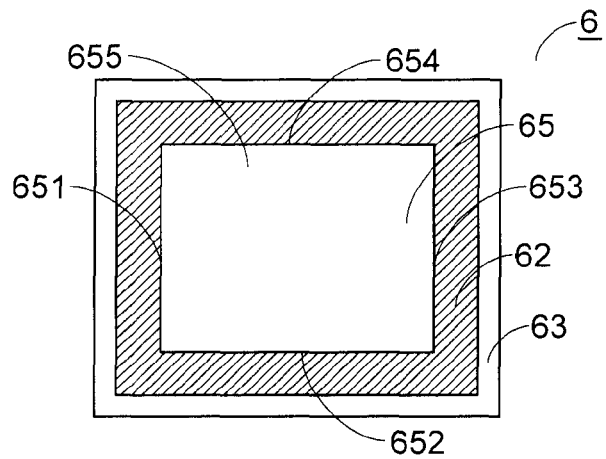
Figure 6C:
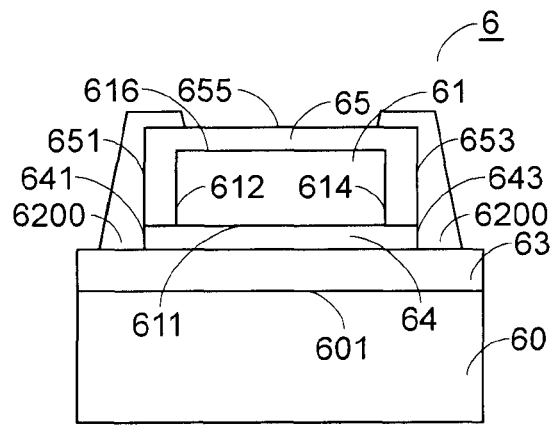
FIG. 6C is a schematic cross-sectional views illustrating a variant of the active matrix display of FIG. 6A.

FIGS. 6A and 6B are respectively schematic cross-sectional and top views of an active matrix display according to a fifth embodiment of the present invention. As shown in FIGS. 6A and 6B, the active matrix display 6 comprises an active matrix substrate 60, a reflective layer 61, a sidewall-protective structure 62, a passivation layer 63, a first metallic oxide layer 64 and a second metallic oxide layer 65. The passivation layer 63 is formed on a top surface 601 of the active matrix substrate 60. In comparison with the above embodiments, the first metallic oxide layer 64 is formed on the passivation layer 63 and contacted with the bottom surface 611 of the reflective layer 61. The area of the reflective layer 61 is smaller than that of the first metallic oxide layer 64 such that the first metallic oxide layer 64 is partially exposed outside the reflective layer 61. In addition, the second metallic oxide layer 65 is formed on the top surface 616 of the reflective layer 61 and the first metallic oxide layer 64 uncovered by the reflective layer 61 and surrounds the sidewalls 612, 614 of the reflective layer 61. The sidewall-protective structure 62 surrounds the sidewalls 641, 643 of the first metallic oxide layer 64 and the sidewalls 651, 652, 653, 654 of the second metallic oxide layer 65. FIG. 6C is a schematic cross-sectional view illustrating a variant of the active matrix display of FIG. 6A. As shown in FIG. 6C, the sidewall-protective structure 6200 surrounds the sidewalls 641, 643 of the first metallic oxide layer 64 and the sidewalls 651, 653 of the second metallic oxide layer 65. In addition, the sidewall-protective structure 6200 is extended over the top surface 655 of the second metallic oxide layer 65 so as to partially cover the edges of the top surface 655 of the second metallic oxide layer 65. The functions of other components are similar to those illustrated in the first embodiment, and are not redundantly described herein.

Figure 7A:
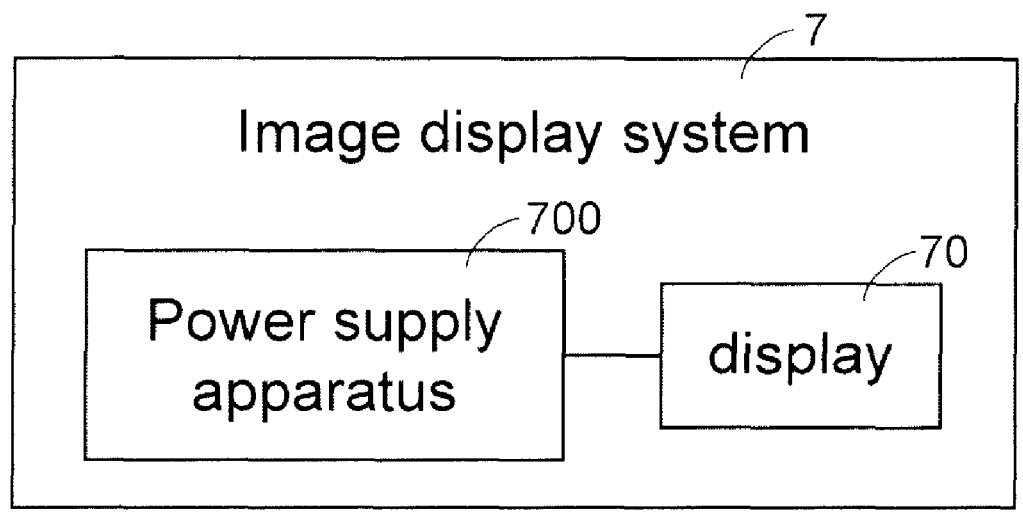
FIG. 7A is a schematic functional diagram illustrating an image display system according to the present invention.

FIG. 7A is a schematic functional diagram illustrating an image display system according to the present invention. The image display system 7 comprises a display 70 and a power supply apparatus 700. The display 70 is for example an OLED device or a LCD. The display 70 has an active matrix display as described in the above embodiments. The power supply apparatus 700 is electrically connected to the display 70 for providing electric energy to the display 70. An example of the image display system 7 includes but is not limited to a mobile phone, a digital camera, a personal digital assistant, a notebook computer, a desktop computer, a TV set, a global positioning system (GPS), an automotive display system, a flight display system, a digital photo frame, a portable DVD player, and the like.

Figure 7B:
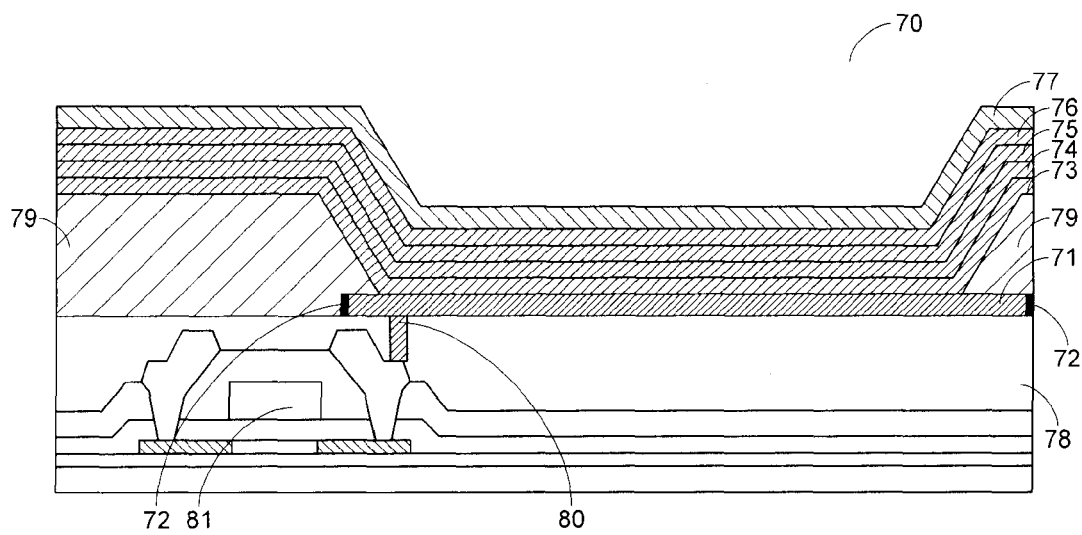
FIG. 7B is a cross-sectional view of an OLED device used in the image display system of the present invention.

FIG. 7B is a cross-sectional view of an OLED device used in the image display system of the present invention. As shown in FIG. 7B, the OLED device 70 comprises a reflective layer 71, a hole transport layer 73, an emission layer 74, an electron transport layer 75, a hole injection layer 76, a cathode layer 77, a passivation layer (planarization layer) 78, an insulator layer 79, a via hole 80 and a gate electrode 81. The reflective layer 71 is also used as an anode layer. By applying an external voltage on the cathode layer 77, the cathode layer 77 is electrically connected with the reflective anode layer 71. Due to the external voltage, the electrons generated from the electron transport layer 75 recombine with holes in the hole transport layer 73 so that the extra energy is released from the emission layer 74 in the form of light. The sidewall-protective layer 72 of the present invention is capable of protecting the reflective layer 71 from being attacked during production. In the above embodiments, the reflective layer 71 has a single-layered structure. Nevertheless, the reflective layer 71 may be an anode layer having a multi-layered structure.

From the above description, since the periphery of the reflective layer is protected by the sidewall-protective layer, the reflective layer of the active matrix display according to the present invention will be enforced and not easily attacked by the acidic/basic action of the etchant solution.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An active matrix display comprising:
   an active matrix substrate;
   a reflective layer formed above the active matrix substrate and having first and second surfaces and sidewalls extending between the first and second surfaces, wherein the second surface faces the active matrix substrate;
   a sidewall-protective structure formed above the active matrix substrate and surrounding the sidewalls of the reflective layer, the sidewall-protective structure extending to partially cover the first surface of the reflective layer by directly contacting part of the first surface of the reflective layer; and
   a metallic oxide layer formed on the active matrix substrate and contacted with the second surface of the reflective layer, the sidewall-protective structure further surrounds the sidewalls of the metallic oxide layer, and an area of the metallic oxide layer is greater than that of the reflective layer such that a portion of the metallic oxide layer is exposed outside the reflective layer.

2. The active matrix display according to claim 1 wherein the active matrix display further comprises a passivation layer formed on the active matrix substrate and contacted with the sidewall-protective structure.

3. The active matrix display according to claim 1 further comprising:
   a hole transport layer formed on the first surface of the reflective layer;
   an emission layer formed on the hole transport layer;
   an electron transport layer formed on the emission layer;
   a hole injection layer formed on the electron transport layer; and
   a cathode layer formed on the hole injection layer.

4. An image display system comprising:
   an active matrix display according to claim 1; and
   a power supply apparatus electrically connected to the active matrix display for providing electric energy to power the active matrix display.

5. The image display system according to claim 4 wherein the image display system is a mobile phone, a digital camera, a personal digital assistant, a notebook computer, a desktop computer, a TV set, a global positioning system, an automotive display system, a flight display system, a digital photo frame or a portable DVD player.

6. The image display system according to claim 4 wherein the active matrix display is a reflective LCD, a transflective LCD or a top emission OLED.

7. The active matrix display according to claim 1 wherein the first and second surfaces are substantially parallel.

8. The active matrix display according to claim 1 wherein the first and second surfaces are surfaces on opposite sides of the reflective layer.

9. The active matrix display according to claim 1 wherein the sidewall-protective structure is made of metallic oxide material.

10. An active matrix display comprising:
    an active matrix substrate;
    a reflective layer formed above the active matrix substrate and having first and second surfaces and sidewalls extending between the first and second surfaces, wherein the second surface faces the active matrix substrate;
    a sidewall-protective structure formed above the active matrix substrate and surrounding the sidewalls of the reflective layer, the sidewall-protective structure extending to partially cover the first surface of the reflective layer by directly contacting part of the first surface of the reflective layer; and
    a metallic oxide layer formed on the first surface of the reflective layer, an area of the metallic oxide layer is smaller than that of the reflective layer, and the sidewall-protective structure further extends over the first surface of the reflective layer so as to partially cover the first surface of the reflective layer and directly contact with the metallic oxide layer.

11. An active matrix display comprising:
    an active matrix substrate;
    a reflective layer formed above the active matrix substrate and having first and second surfaces and sidewalls extending between the first and second surfaces, wherein the second surface faces the active matrix substrate;
    a sidewall-protective structure formed above the active matrix substrate and surrounding the sidewalls of the reflective layer, the sidewall-protective structure extending to partially cover the first surface of the reflective layer by directly contacting part of the first surface of the reflective layer; and
    a passivation layer formed on the active matrix substrate and contacted with the sidewall-protective structure;
    a first metallic oxide layer formed on the passivation layer and contacted with the second surface of the reflective layer; and
    a second metallic oxide layer formed on the first surface of the reflective layer.

12. The active matrix display according to claim 11 wherein the sidewall-protective structure further surrounds the sidewalls of the first metallic oxide layer.

13. The active matrix display according to claim 11 wherein the sidewall-protective structure further surrounds the sidewalls of the first metallic oxide layer and the second metallic oxide layer is formed on the first surface of the reflective layer and the sidewall-protective structure.

14. An active matrix display comprising:
    an active matrix substrate;
    a reflective layer formed above the active matrix substrate and having first and second surfaces and sidewalls extending between the first and second surfaces, wherein the second surface faces the active matrix substrate;
    a sidewall-protective structure formed above the active matrix substrate and surrounding the sidewalls of the reflective layer, the sidewall-protective structure extending to partially cover the first surface of the reflective layer by directly contacting part of the first surface of the reflective layer; and a metallic oxide layer formed on the first surface of the reflective layer, wherein the sidewall-protective structure further surrounds sidewalls of the metallic oxide layer and is extended over the first surface of the reflective layer so as to partially cover the first surface of the reflective layer, wherein an area of the metallic oxide layer is smaller than that of the reflective layer such that the reflective layer is partially exposed by the metallic oxide layer to be covered by the sidewall-protective structure.

15. The active matrix display according to claim 14, wherein the sidewall-protective structure further extends to partially cover top surface of the metallic oxide layer.

16. An active matrix display comprising:
   an active matrix substrate;
   a reflective layer formed above the active matrix substrate and having first and second surfaces and sidewalls extending between the first and second surfaces, wherein the second surface faces the active matrix substrate;
   a sidewall-protective structure formed above the active matrix substrate and surrounding the sidewalls of the reflective layer, the sidewall-protective structure extending to partially cover the first surface of the reflective layer by directly contacting part of the first surface of the reflective layer; and
   a metallic oxide formed on the active matrix substrate and contacted with the second surface of the reflective layer, and area of the metallic oxide is smaller than that of the reflective layer such that the metallic oxide layer is surrounded by the reflective layer.

17. An active matrix display as in claim 16, wherein the sidewall-protective structure further surrounds the sidewalls of the metallic oxide layer and is extended over the first surface of the reflective layer so as to partially cover the first surface of the reflective layer.

* * * * *